(12) United States Patent
par Gunnars

(10) Patent No.: US 8,879,754 B2
(45) Date of Patent: Nov. 4, 2014

(54) SOUND REPRODUCING SYSTEM WITH SUPERIMPOSED DIGITAL SIGNAL

(75) Inventor: Risberg par Gunnars, Rydsvägen (SE)

(73) Assignee: Actiwave AB (SE)

( * ) Notice: Subject to any disclaimer, the term of this patent is extended or adjusted under 35 U.S.C. 154(b) by 553 days.

(21) Appl. No.: 12/525,810

(22) PCT Filed: Feb. 5, 2008

(86) PCT No.: PCT/SE2008/000096
§ 371 (c)(1),
(2), (4) Date: Aug. 4, 2009

(87) PCT Pub. No.: WO2008/097159
PCT Pub. Date: Aug. 14, 2008

(65) Prior Publication Data
US 2010/0074457 A1     Mar. 25, 2010

(30) Foreign Application Priority Data
Feb. 8, 2007  (SE) ..................... 0700315

(51) Int. Cl.
*H03F 99/00*  (2009.01)
*G06F 17/00*  (2006.01)
*H04S 7/00*  (2006.01)
*H03F 3/68*  (2006.01)
*H04R 27/00*  (2006.01)
*H04R 3/14*  (2006.01)
*G06F 1/26*  (2006.01)

(52) U.S. Cl.
CPC *H04R 27/00* (2013.01); *H04S 7/30* (2013.01); *H04R 3/14* (2013.01); *H03F 3/68* (2013.01); *G06F 1/266* (2013.01); *H04R 2227/003* (2013.01); *H03F 2200/03* (2013.01)

USPC ............... 381/120; 381/1; 381/18; 381/103; 381/26; 381/63; 381/86; 381/85; 381/82; 381/81; 381/77; 381/105; 330/126; 330/302; 330/306; 340/12.32; 340/855.8

(58) Field of Classification Search
USPC ........... 381/1, 18, 103, 26, 63, 86, 85, 82, 81, 381/77, 105, 120; 330/126, 302, 306; 340/12.32, 855.8
See application file for complete search history.

(56) References Cited

U.S. PATENT DOCUMENTS 3,369,078 A * 2/1968 Stradley ............... 381/2
4,829,570 A * 5/1989 Schotz ................. 381/3
(Continued)

FOREIGN PATENT DOCUMENTS

DE  3925919 A1  3/1991 ......... H04R 1/28
JP  2001148894 A * 5/2001
(Continued)

OTHER PUBLICATIONS

Freed , Bidirectional AES/EBU Digital Audio and Remote power over a single cable,CNMAT, 1999.*
(Continued)

*Primary Examiner* — Davetta W Goins
*Assistant Examiner* — Kuassi Ganmavo
(74) *Attorney, Agent, or Firm* — Hayes Soloway P.C.

(57) ABSTRACT

A home use sound reproduction system for Hi-fi, with digital signal transfer from a playback unit via a control unit to one or more active loudspeakers, each including or arranged beside an amplifier unit. The control unit is arranged to control sound parameters and send both a digital sound information signal and a power signal for powering the amplifier units, and to superimpose the single ended or differential digital signal together with the power signal on at least one common lead in a cable.

21 Claims, 7 Drawing Sheets

(56) References Cited

U.S. PATENT DOCUMENTS

| | | | |
|---|---|---|---|
| 5,129,006 A * | 7/1992 | Hill et al. | 381/100 |
| 5,349,301 A * | 9/1994 | Kaiwa | 330/126 |
| 5,390,246 A | 2/1995 | Gay et al. | 381/24 |
| 5,832,096 A * | 11/1998 | Hall | 381/400 |
| 5,983,087 A * | 11/1999 | Milne et al. | 455/149 |
| 5,994,998 A * | 11/1999 | Fisher et al. | 375/258 |
| 6,178,514 B1 * | 1/2001 | Wood | 713/300 |
| 7,356,603 B2 * | 4/2008 | Singhi | 709/229 |
| 7,668,321 B2 | 2/2010 | Hupp | 381/120 |
| 7,672,465 B2 * | 3/2010 | Iwamura | 381/77 |
| 7,945,067 B2 * | 5/2011 | Mott et al. | 381/334 |
| 2002/0071576 A1 * | 6/2002 | Munro | 381/99 |
| 2002/0072816 A1 * | 6/2002 | Shdema et al. | 700/94 |
| 2003/0081120 A1 * | 5/2003 | Klindworth | 348/143 |
| 2003/0220705 A1 * | 11/2003 | Ibey | 700/94 |
| 2004/0071059 A1 * | 4/2004 | Kikuchi et al. | 369/47.23 |
| 2004/0125968 A1 * | 7/2004 | Pearce et al. | 381/120 |
| 2004/0161122 A1 | 8/2004 | Nielsen | 381/117 |
| 2004/0220687 A1 * | 11/2004 | Klotz et al. | 700/94 |
| 2004/0223622 A1 * | 11/2004 | Lindemann et al. | 381/79 |
| 2004/0225388 A1 * | 11/2004 | Zhang et al. | 700/94 |
| 2005/0094735 A1 * | 5/2005 | Crawford | 375/257 |
| 2005/0141724 A1 * | 6/2005 | Hesdahl | 381/58 |
| 2005/0169297 A1 * | 8/2005 | Lehr et al. | 370/445 |
| 2005/0177256 A1 | 8/2005 | Shintani et al. | 700/94 |
| 2006/0020354 A1 * | 1/2006 | Lorkovic | 700/94 |
| 2006/0229752 A1 | 10/2006 | Chung | 700/94 |
| 2006/0238241 A1 | 10/2006 | Pearce et al. | 330/10 |
| 2006/0271215 A1 | 11/2006 | Janke et al. | 700/94 |
| 2006/0294569 A1 * | 12/2006 | Chung | 725/133 |
| 2007/0222631 A1 * | 9/2007 | Haase | 340/691.5 |
| 2007/0223722 A1 * | 9/2007 | Merrey et al. | 381/77 |
| 2010/0267332 A1 * | 10/2010 | Lui | 455/3.06 |

FOREIGN PATENT DOCUMENTS

| | | | |
|---|---|---|---|
| JP | 2005223372 A * | 8/2005 | |
| WO | WO 02/093973 A1 | 11/2002 | H04R 1/00 |

OTHER PUBLICATIONS

Supplementary European Search Report issued in corresponding application No. 08712703.1, dated Feb. 19, 2013 (10 pgs).

* cited by examiner

SOUND REPRODUCING SYSTEM WITH SUPERIMPOSED DIGITAL SIGNAL

BACKGROUND OF THE INVENTION

The present invention concerns a sound reproduction system for Hi-fi with subsystems for integration into conventional passive loudspeakers, in order to transform these loudspeakers into high performance active loudspeakers. Hi-fi is synonymous with High Fidelity and refers in the following to a sound system for home use that in particular strives to provide a sound that is as lifelike as possible. In other words the sound reproduction system is designed to provide a sound that the listener perceives as very or entirely like the original. Such systems require both high precision and great power.

SUMMARY OF THE INVENTION

The complete system of the invention comprises active loudspeakers 7, an amplifier unit 9, a power supply unit 6, a control unit 4, equipment 2 for the reproduction of sound that has been stored or is received in a digital or analogue form, and a cable or cables 10. By active loudspeakers is meant, loudspeakers with integrated amplifiers. In other words, the amplifiers for the loudspeakers are physically located in the same units as the loudspeaker drivers 11, 12 and 13 that transform the electric signals into sound. The amplifying units may preferably be printed circuit boards for integration into the loudspeaker enclosures and further comprise components designed to receive and transform a standardised digital electric sound signal into a digital signal with separate sound data and a clock signal 14 suitable for a digital signal processor (DSP) 15. The amplifying units further comprise digital signal processing components 15, 19, power components 14, 18 for providing a power supply to the amplifying unit and the digital circuits, signal conditioning components 16a, 16b, and 16c for transforming the digital signals into analogue signals, and amplifying components 17a, 17b, 17c or 20 for amplifying digital or analogue audio signal.

By power supply unit is meant a subsystem that converts the alternating voltage of supply mains to one or several DC-voltage levels suited to drive the amplifying units 9. The power supply unit 6 comprises at least one transformer for the transforming of the AC-voltage level and at least one rectifier for the conversion from AC to DC. Within the concept of the invention this or these rectifiers may be physically separated from the transformer and instead integrated with the amplifier unit 9.

By control unit is meant a unit that conditions and transmits a digital sound signal together with the power supply current via a cable 10 to the active loudspeaker 7. The control unit may comprise for instance volume control, bass and treble controls, selection between different sound sources or other controls that allow the user to control the sound and may have receivers for interacting with a remote control playback of sound that has been stored or transmitted The equipment 2, in the following referred to as a playback unit 2, is a unit presenting a digital sound signal to the system from a live source, as a microphone or musical instruments, or stored sound from for instance CD™, SACD™, DVD™, DVD-Audio™, HD-DVD™, Blu-Ray™, hard drive, alternative types of data memory, or internet. Also TV-/radio receivers, gaming consoles, or other equipment with digital sound output can constitute a playback unit 2. The playback unit 2 may be an integrated part of the control unit for instance a CD-player, analog to digital converter (A/D converter) for analog sound received from microphones or musical instruments.

A cable 10 includes at least one electric lead that is preferably electrically isolated from the surroundings along its length save at the ends of the cable. If a cable contains two or more electric leads these leads are also electrically isolated from each other. A cable may include an electrically conductive shielding intended to prevent electromagnetic interference from being induced in its leads.

The state of the art regarding active Hi-fi loudspeakers have several problems. To integrate the amplifier in the loudspeaker enclosure requires, for instance, that the loudspeaker must be designed in consideration of this from the beginning since the power unit will take up a considerable volume in the loudspeaker enclosure. This makes active loudspeakers for Hi-fi very expensive to develop. It is a large step for a manufacturer to develop such speakers from scratch, as they require an entirely new construction and additional advanced electronics. The suggested invention alternatively enables the modification of existing passive loudspeakers to form active ones, since the amplifier unit 9 is of the same physical size as the passive electronics that is found in passive loudspeakers.

With today's technology, this is only realistic for Hi-fi by separating the power supply unit 6 from the active loudspeaker 7. To integrate larger electronic units than those of a passive loudspeaker, the enclosure design would influence the sound character negatively since the volume and shape are very important parameters to achieve Hi-fi. The invention makes it possible to achieve the advantages of active loudspeakers from traditional, passive loudspeakers.

In active loudspeakers for Hi-fi that have been designed as such from the start, the performance of the power supply electronics must be weighed against the space it may take in the loudspeaker enclosure and how large and heavy the loudspeaker may be. If the power supply unit is under dimensioned, the performance of the sound system is considerably impaired. Furthermore the power supply unit develops heat near to the output transistors of the amplifiers and both must be cooled in an efficient way. This leads to the amplifier cooling device becoming unnecessarily bulky.

In addition to the problems with the development of active loudspeakers, the existing technology also presents a number of problems for the user. One example is the placement of the cables that is far more extensive for the active Hi-fi Loudspeakers of today than for traditional, passive ones. Each loudspeaker enclosure requires power supply cable and a signal cable. Furthermore several solutions require a third cable for control of the integrated amplifier. The presence of several cables in connection to each loudspeaker makes cleaning more difficult and many users also find it unattractive. Many users are unwilling to route long cables to the wall sockets. Also the furnishing alternatives will be limited, since the loudspeakers must be placed in a region with access to wall sockets.

Problems with control of the amplifiers in the active loudspeakers of today are also present since there is no control unit 4. In conventional systems with passive loudspeakers there is an external amplifier or pre-amplifier that is also used to adjust sound volume, for instance. In digital systems with active loudspeakers for Hi-fi such adjustments must instead be made directly at the loudspeakers, physically or via remote control. The implementation of the invention instead looks exactly like a conventional system with passive loudspeakers, since the control unit for the user looks like and functions as the amplifier or preamplifier in the conventional system with passive loudspeakers.

The invention solves the above problem by physically separating the power supply unit 6 from the active loudspeaker 7. This allows the amplifying unit 9 to be made sufficiently small to enable said integration in passive loudspeakers, without having to compromise the sound quality regarding power or precision. The separation of the power supply unit and the amplifier unit enables a solution to the problem of several cables in connection with each active loudspeaker, since one single cable 10 delivers both a digital sound signal and a power supply signal from the control unit 4 to the active loudspeaker 7. In order to drive amplifiers for Hi-fi, the cable 10 must be able to deliver a continuous power of at least 160 watts to each active loudspeaker 7. Amplifiers of, for instance, type class-D can be obtained with a very high efficiency. Such a solution could possibly lower the demand for power transfer and thereby, to a degree, reduce the cross section of the leads in the cable 10. This is however not suitable for Hi-fi with today's technology since the distortion is greater for class D and similar solutions than for analogue amplifiers as for instance class-A, class-AB and class-B. This distortion is most obvious for sound with higher frequencies, which means that amplifiers for midrange and treble preferably should be analogue. Class-D and similar amplifier technologies with high efficiency are suitable for sound with low frequency (bass) since the distortion in those ranges is comparatively large from, for instance, loudspeaker drivers. This means that the demand on the precision of the amplifier therein is lowered. Furthermore it is bass reproduction that requires the most power. Irrespective of if amplifiers with high efficiency are used, each active loudspeaker for genuine Hi-fi should have amplifiers with a total power output of at least 150 watts. With minimal losses this means that the cable 10 should be designed to deliver an output of at least 160 watts continuously.

The invention also enables the use of a standard cable with so few leads that no special connectors are required in the ends for simple mounting. This means that the user may obtain the cable 10 sold by the meter to be cut in optimal lengths for efficient and practical placing of the cables in all types of rooms.

Additionally the system provides other known advantages, since the control unit 4 delivers a digital audio signal all the way to the amplifier 9 in the active loudspeaker 7. This provides noise free signal transfer entirely without audible disturbances all the way to the loudspeaker enclosure, since the amplifying unit 9 can work with exactly the same sound data that is stored in the storage media 1. In loudspeakers for Hi-fi it is desirable to separate the electric signal in at least two frequency ranges with a so called crossover filter. This is because there does not exist today, loudspeaker drivers for Hi-fi that can handle the entire audible frequency range. Instead, separate loudspeaker drivers must be used for at least low and high frequency sounds (bass and treble respectively). In order to further increase the accuracy of the sound reproduction, the signal is frequently separated into three or more separate loudspeaker drivers, for instance bass, midrange and treble. Thereby, the loudspeaker drivers only have to work in the frequency ranges where their sound characteristics are at their best. By replacing the analogue separation filter in conventional active speakers with digital filters in the processing device 15, the invention enables a filter design that in reality is impossible with analogue electronics. Furthermore the processing device 15 can compensate and enhance the sound characteristics digitally, which further increase the accuracy of the sound reproduction so that the sound reproduction system produces nearly ideal Hi-fi sound.

Since the invention provides an electric analogue audio signal only in a minimal part of the sound reproduction system, it is very insensitive to disturbances and the resulting noise level will be minimal.

DETAILED DESCRIPTION OF THE INVENTION

The description follows the path of the signal from the playback unit to the loudspeaker drivers.

The signal from the digital playback unit usually conforms to a standard for the digital transfer of sound, for instance S/PDIF (belong to standard IEC-60958), AES/EBU (belongs to standard AES3) or DSD™ (direct stream digital). The signal may either contain information of uncompressed sound samples (for instance pulse-code modulated—PCM), a compressed data stream that has to be decoded before it can be reproduced (for instance Dolby Digital™ or DTS™), or a data stream that directly corresponds to a sound signal if it is to be sent directly through suitable hardware (DSD™). The control unit 4 or the processing unit 15 in the amplifier unit 9 is capable of decoding a compressed data stream.

Figure 6:
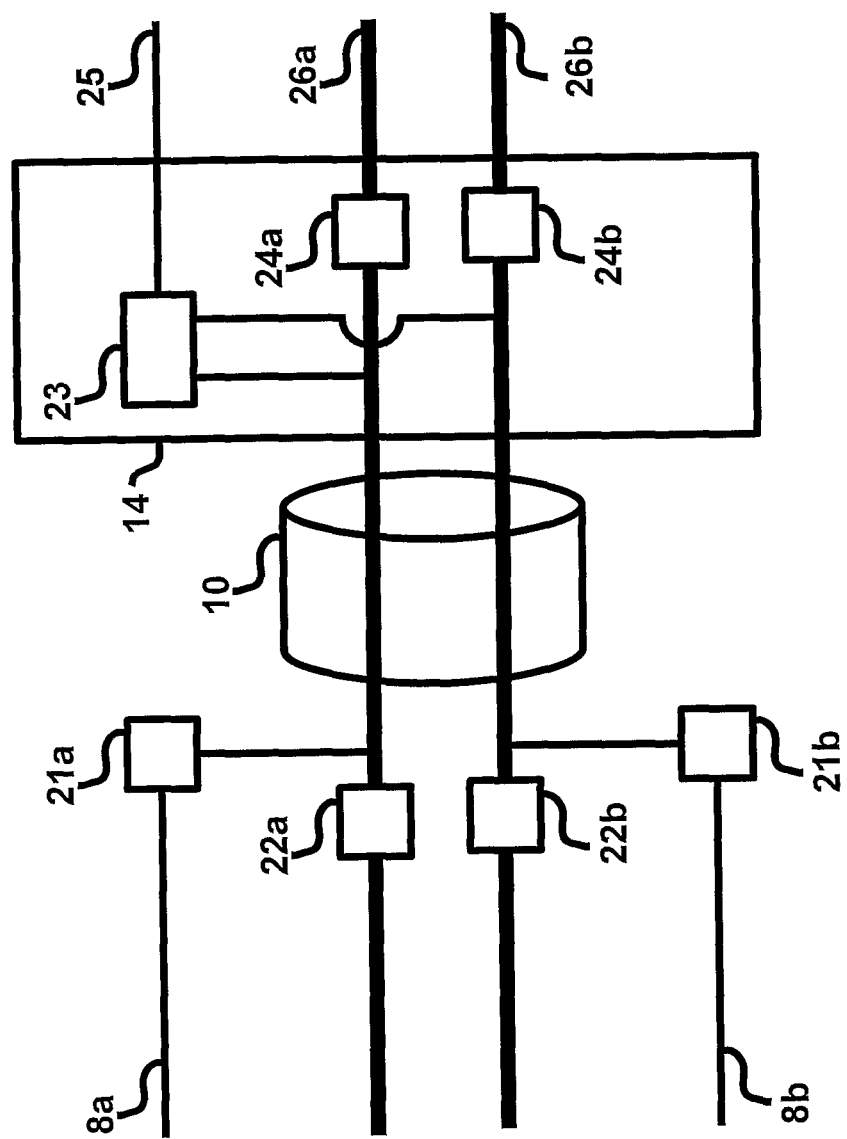
FIG. 6 depicts an example of superimposing signals that enables the transfer of a stepped down direct or alternating current feed and a differential digital signal via a cable 10 with two leads. Numerals in the figure followed by a letter indicate several components of the same type.
Figure 7:
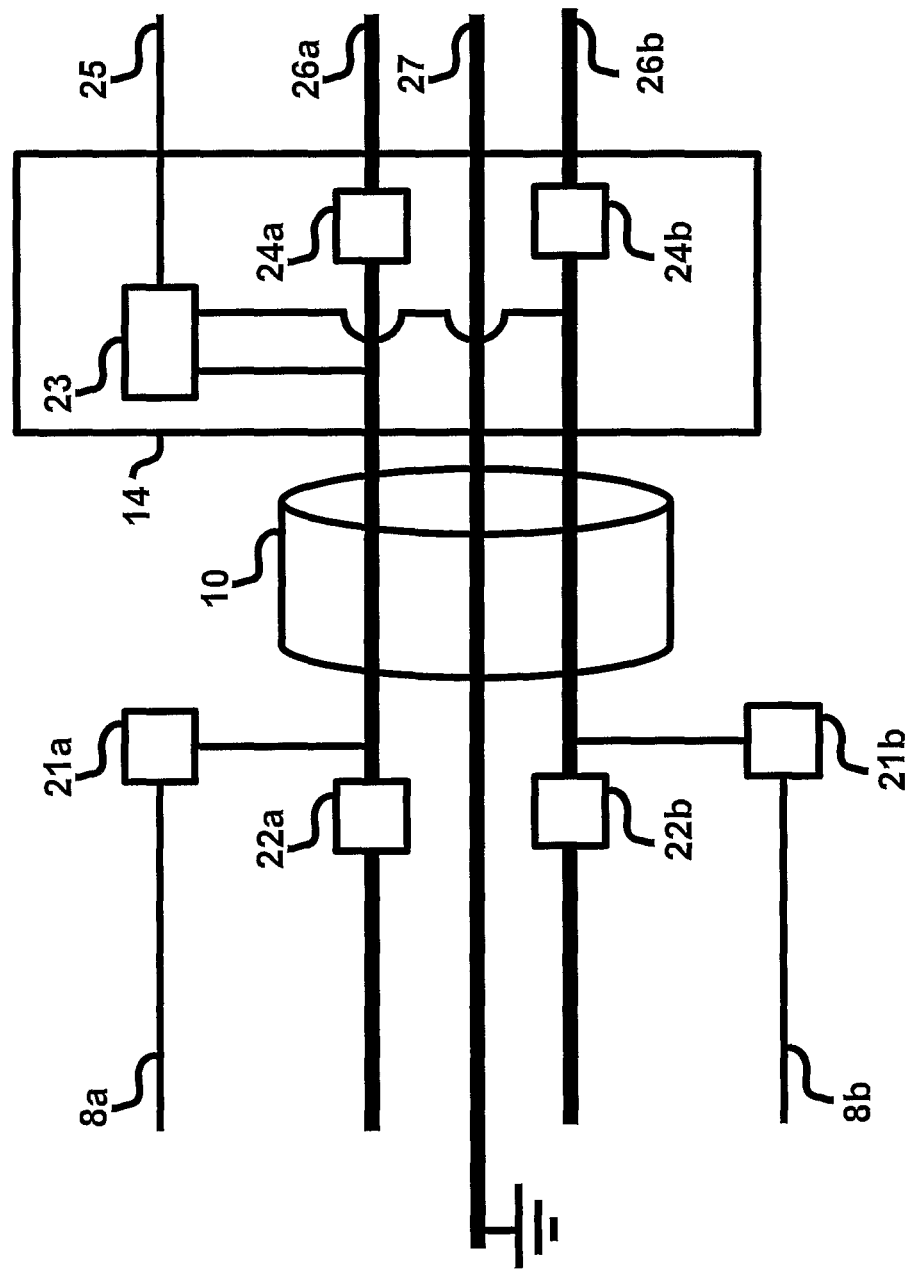
FIG. 7 depicts an example of superimposing signals that enables the transfer of a stepped down direct current signal, with both positive and negative voltage relative the ground, in combination with a differential digital signal via a cable with three leads. Numerals in the figure followed by a letter indicate several components of the same type.

In a preferred embodiment, the control unit 4 prepares the signal with or without said decoding, by transforming it so that it conforms to the AES/EBU-standard for uncompressed stereo sound. In order to enable the control unit 4 to send sound parameters, as for instance volume and other signal adjustments to the amplifier unit 9, the control unit places all such information in the part of the outgoing data stream that, in the standard, is named "User Data". This is the part of the protocol that that can be set arbitrarily without violating the specifications of the standard. In addition to the basic re-encoding of the data, additional optional modification of the data, as for instance correction for the acoustics of the room, take place in the control unit 4. The control unit 4 then superimposes the AES/EBU-signal 8a and 8b according to FIG. 6 or FIG. 7. High pass filters 21a, 21b and 23 and low pass filters 22a, 22b 24a and 24b are arranged to separate the digital signal and the direct current feed on the sending and receiving sides. The high pass filter 23 also contains an AES/EBU-receiver that transforms the AES/EBU-signal into a suitable format, for instance I²S, on the data bus 25 that interfaces with the processing device 15. Between the control unit 4 and the amplifier unit 9, a cable 10 with at least two leads is arranged to connect these components. Thick leads enable transport of large direct currents for active loudspeakers 7 intended for Hi-fi.

Figure 5:
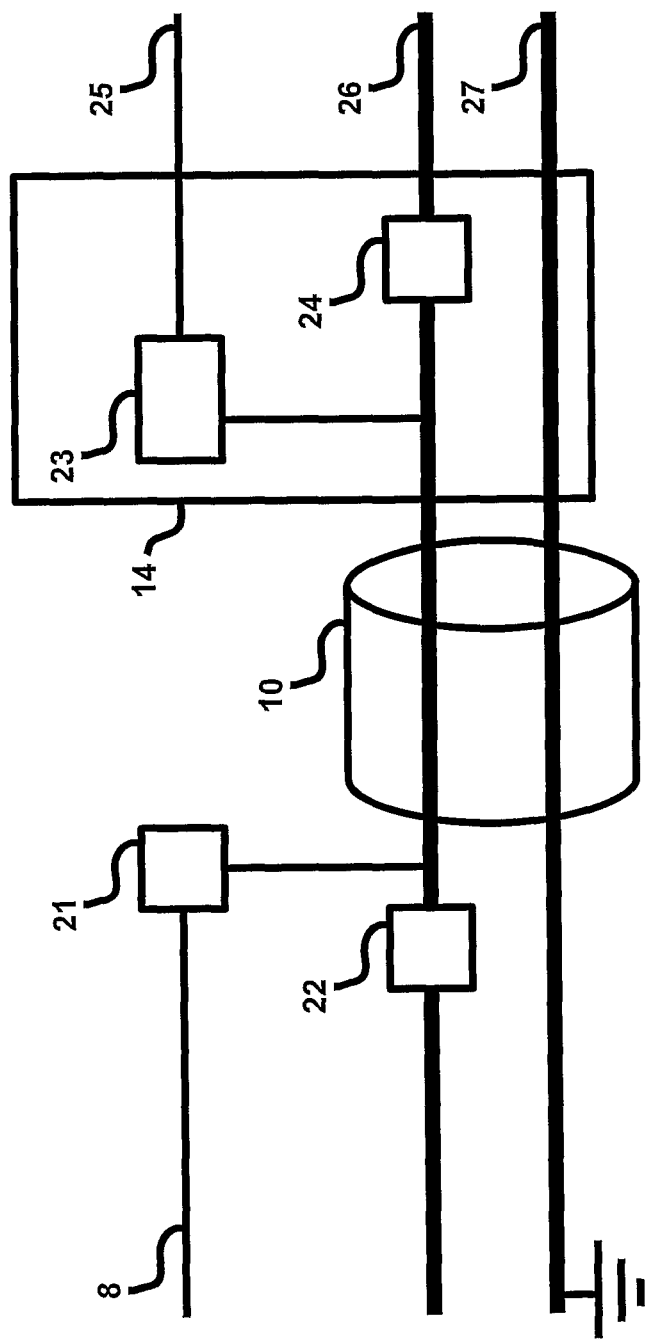
FIG. 5 depicts an example of superimposing signals that enables the transfer of a stepped down direct or alternating current feed and a single ended digital signal via a cable 10 with two leads. Numerals in the figure followed by a letter indicate several components of the same type.

In another preferred embodiment, the control unit 4 prepares the signal with or without said decoding, by transforming it so that it conforms to the S/PDIF-standard for uncompressed stereo sound. The control unit can re-encode the signal as in the preceding embodiment with the only difference being that the coding in this embodiment follows the S/PDIF-standard. The control unit 4 then superimposes the S/PDIF-signal 8 according to FIG. 5. The high pass filters 21 and 23 and the low pass filters 22 and 24 are arranged to separate the digital signal and the power signal on the sending and receiving side respectively. The high pass filter 23 also contains an S/PDIF-receiver that transforms the S/PDIF-signal into a suitable format, for instance I²S, on the data bus 25 that interfaces with the processing device 15. Between the control unit 4 and the amplifier unit 9, a cable 10 with two leads is arranged to connect these units. Thick leads enable transport of large currents for active loudspeakers 7, intended for Hi-fi.

In yet another embodiment the control unit sends the digital sound signal through a separate lead in the same cable as the current supply to the amplifier unit 9 which requires three to four leads depending on if the amplifier unit 9 also requires negative voltage supply in relation to ground.

In yet another embodiment of the invention, the system looks as in some of the preceding embodiments, but the digital signal, delivered by the control unit 4 to the active loudspeakers 7, is encoded differently, or alternatively modulated in a carrier wave, that enables the amplifier unit 9 to interpret the digital content of the signal with an appropriate receiver 14.

In another embodiment of the invention, the system looks as in one of the preceding embodiments, but the control unit does not carry out any re-encoding, but instead the processor 15 in the amplifier unit 9 carries out corresponding re-encoding. This solution requires that information of sound volume is provided in the data stream from the play back unit 2, that the control unit 4 puts this information into an otherwise unchanged, compressed data stream or that the sound data in itself has been altered to adjust the volume.

The amplifying unit 9 extracts data with an appropriate receiver 14 and treats the direct or alternating current in leads 26 and 27 (FIG. 5), or alternatively in leads 26a, 26b and 27 (FIG. 6 or FIG. 7), to provide the amplifier unit 9 with suitable voltage levels for the different components comprised therein. That the entire power supply unit or its converter 6 is physically separated from the amplifier's active components, for instance 17 or 20 does not mean a decline in performance. In order to enable delivery of large currents to the amplifiers 17 or 20, appropriate capacitors 18 are coupled in parallel to the current feed of the amplifiers. The capacitors 18 can, when they are charged, deliver very large currents for a short time.

Figure 1:
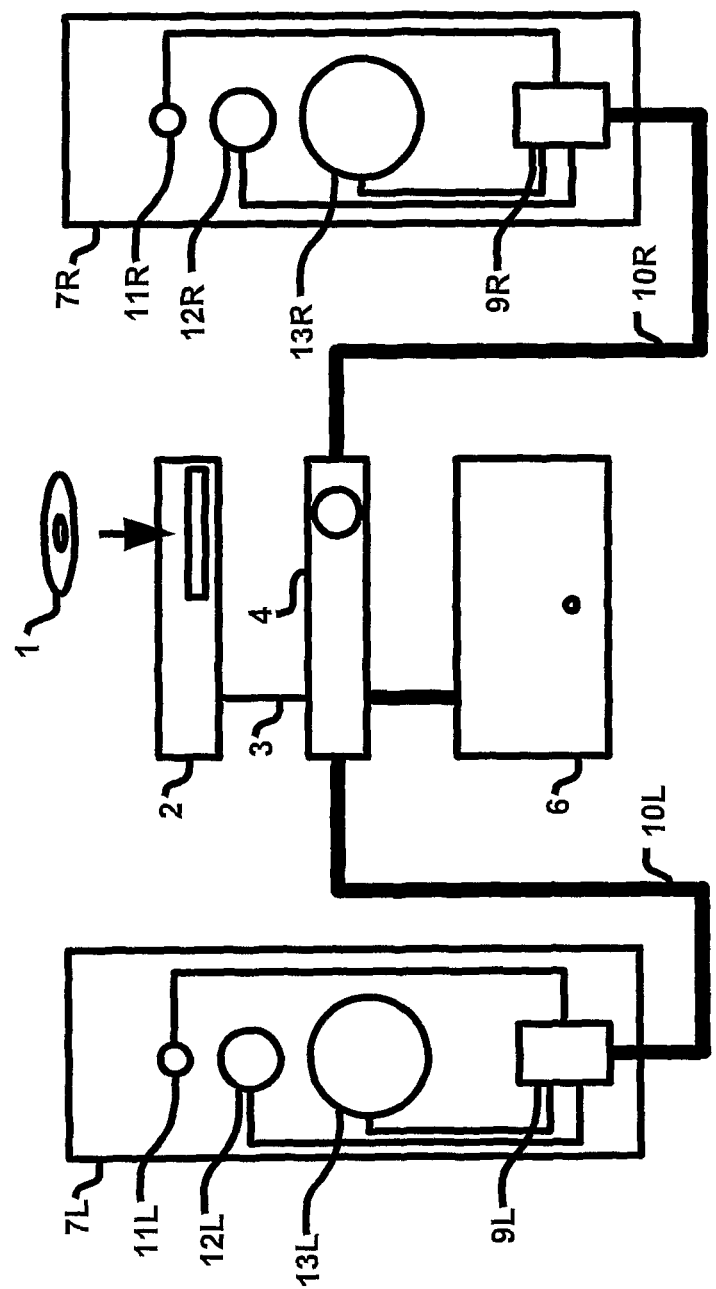
FIG. 1 depicts an overview of what is referred to as a sound reproduction system. Numerals in the figure followed by a letter indicate several identical components. In particular L, R and C after a numeral indicates left, right and centre examples of the same type of component. This is an example system for 3-way (bass, midrange and treble) 3-channel sound (L, R and C), but the invention is not limited to 3-channel sound but the number of amplifier units 9 and loudspeakers in the system may be arbitrary. Likewise the number of loudspeaker drivers 11, 12 or 13, and the number of amplifiers 17, or 20 that are connected to each amplifier unit 9 are arbitrary.
Figure 2:
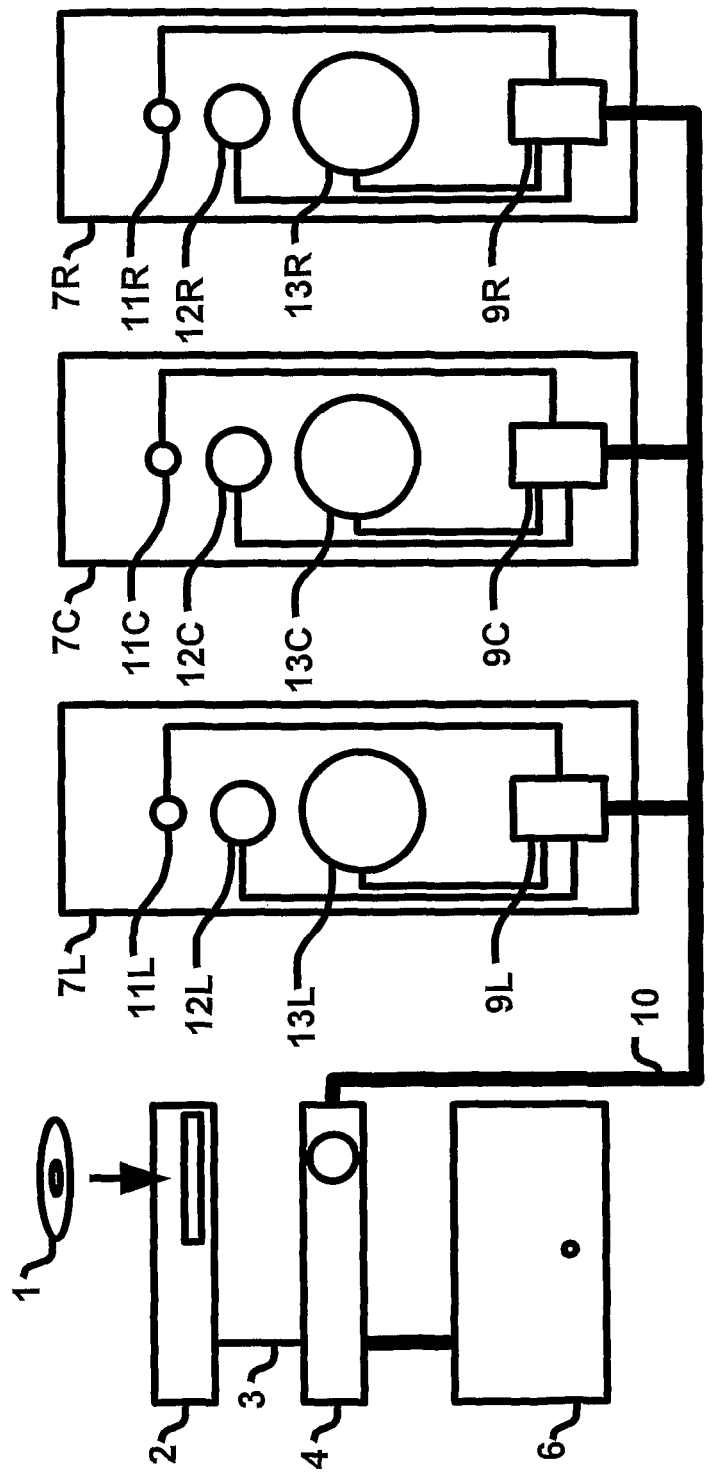
FIG. 2 depicting the same sound reproduction system as FIG. 1 but with an alternative cable arrangement between the control unit 4 and the active loudspeakers 7 that is not possible with passive loudspeakers, is illustrated.
Figure 3:
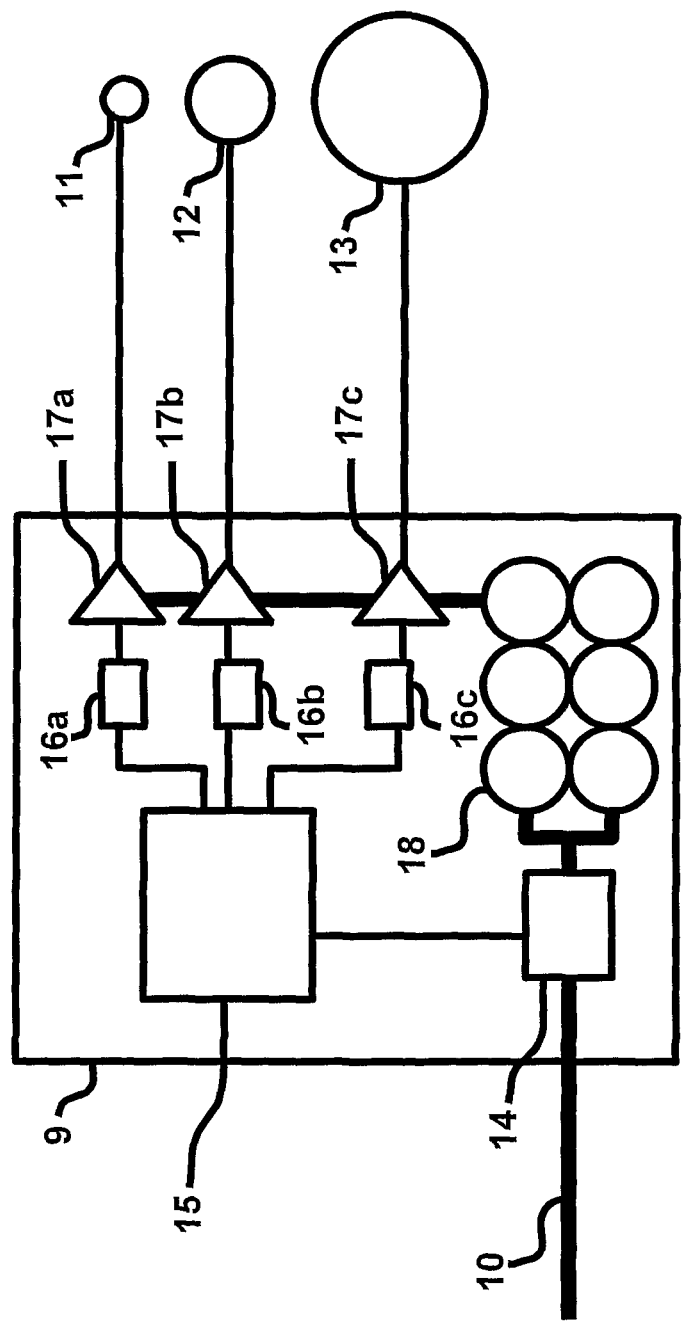
FIG. 3 depicts a possible design of the amplifier unit 9 with signal transformation from a digital into an analogue signal before the amplifier for each channel. Only key components are illustrated. Numerals in the figure followed by a letter indicate several components of the same type.

In a preferred embodiment (FIG. 3), the digital to analogue signal converters (D/A-converters) 16a, 16b and 16c are arranged to provide an analogue electric signal that directly corresponds to the sound waves that the loudspeaker drivers 11, 12 and 13 are to emit in the room. The analogue amplifiers 17a, 17b and 17c of the type class-A, class-AB, class-B or the like are arranged to amplify the electric audio signal provided by the D/A-converters 16a, 16b and 16c.

Figure 4:
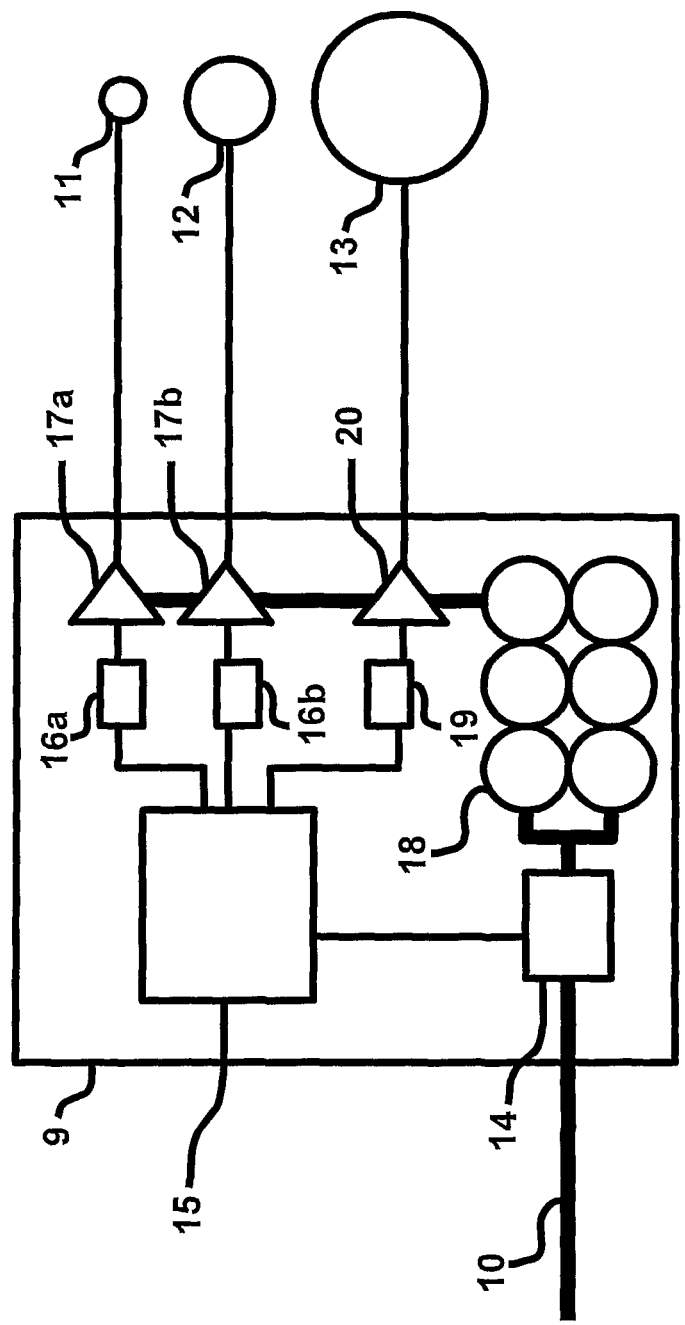
FIG. 4 depicts another possible design of the amplifier unit 9 with signal transformation for at least some of the channels from digital PCM-data to digital PWM-data 19 followed by an amplifier 20 intended for this type of input signal, for instance an amplifier of the type class-D. Only key components are illustrated. Numerals in the figure followed by a letter indicate several components of the same type.

In another preferred embodiment (FIG. 4), the digital PCM-signal to PWM-signal converters (PWM-processors) 19 are arranged to create, after the processing device 15, a digital PWM-signal on at least one of the channels of the same amplifier unit 9, for instance the channel for low frequency signals (bass). In order to amplify this PWM-signal, an amplifier of type class-D or the like 20 is arranged, which gives a high efficiency.

In a another embodiment, an amplifier with high efficiency 20, for instance of the type class-D, is arranged in at least one of the channels in the same amplifier unit 9, for instance the channel for low frequency signals (bass), to amplify an analogue signal created by a D/A-converter 16. A class-D amplifier delivers a pulsed signal where the duration or mutual distance is controlled so that, when they are integrated by the mechanical inertia in a bass driver, the desired sound is obtained while the overtones generated by the pulse train are extinguished by the same inertia. Since the amplifier principally works as a switch, the power losses and heat generation in the amplifier will be small. This type of amplifier is nevertheless often provided with an electric reconstruction filter at the output which removes high frequency components before the cable that is arranged to deliver the signal to the loudspeaker driver in question. This is in order to provide an improved sound quality and at the same time minimize the antenna effects that otherwise arise.

After amplifying and optional reconstruction filtering in the preamplifiers 17 or 20, a loudspeaker cable is arranged to connect each one of these amplifiers directly with their loudspeaker driver 11, 12 and 13.

Within the concept of the invention one can also mount the amplifier units on the back side of their loudspeaker to provide an analogue sound signal that is also filtered by the integrated filter of the loudspeaker. In this way, existing loudspeakers may be used without dismantling.

Within the concept of the invention, the amplifier units in or on the loudspeakers may individually, either by adjustment of each amplifier unit or centrally from the control unit, be adjusted so as to alter the frequency band limits, the slope of the filters, and other parameters for the driving of the loudspeaker drivers in the loudspeakers.

The invention allows the user to choose many alternative ways to connect the loudspeakers to the control unit, including in a chain after each other and/or with branching off wherever it is practical or desired in order to reduce the amount of cables. The sound information can be delivered to all the loudspeakers and the amplifier for each loudspeaker can sort out its own individual sound information undisturbed by the sound information to the other loudspeakers. Furthermore the cables may be connected lead by lead instead of by connectors, allowing cables to be easily cut to the right length, just as is done with analogue loudspeakers but with fewer meters of cables on the floor.

The invention is not limited to the use of only three loudspeakers and the control unit may receive the sound signals in different ways and from different sources including via the local mains through a wall socket or via a wireless transmission.

The invention claimed is:

1. A home use sound reproduction system for customer installation, comprising:
   a control unit, having:
      a power input,
      a user interface, allowing at least one of volume control, bass control, treble control and sound source selection,
      a digital playback input,
      a digital speaker output,
      the control unit being adapted to provide digital signal transfer of S/PDIF signals directly from a playback unit, connected to the playback input, to one or more active loudspeakers, connected to the digital speaker output;
   an active loudspeaker, comprising:
      a loudspeaker cabinet,
      at least one loudspeaker driver, and
      an amplifier unit included in or arranged beside the loudspeaker cabinet and being arranged for driving the at least one loudspeaker driver; and
   a two-lead speaker cable adapted for supplying at least 160 watts continuous power, being adapted to directly connect the digital speaker output of the control unit to the active loudspeaker by bare lead ends without any connector;
   wherein the control unit and the active loudspeaker are separate physical entities, which are positionable at a distance from each other and interconnectable by the cable;
   wherein the control unit is arranged:
      (i) to control sound parameters and send both a digital sound information signal dedicated for digital transfer of S/PDIF sound signals and a direct current power signal for powering the amplifier unit through the cable, and
      (ii) to superimpose the digital sound information signal, in the form of a single ended or differential digital signal, together with the direct current power signal on at least one common lead in the cable, wherein the S/PDIF sound signals directly received from the playback unit are superimposed on the power signal without an encoder.

2. The home use sound reproduction system according to claim 1, wherein the power signal is a direct current feed.

3. The home use sound reproduction system according to claim 1, wherein the power supply unit for powering the active loudspeakers is comprised in the control unit.

4. The home use sound reproduction system according to claim 1, wherein at least one of the loudspeakers comprises multiple loudspeaker drivers, and the amplifier unit corresponding to the at least one loudspeaker, is arranged to condition the digital signal, and provide an appropriately conditioned signal to each loudspeaker driver.

5. The home use sound reproduction system according to claim 4, wherein the amplifier unit comprises a digital crossover filter for at least two frequency ranges and is arranged to provide at least one of: equalization, voltage limiting, dynamic range processing, dynamic equalization, volume and, noise gating.

6. The home use sound reproduction system according to claim 5, wherein the amplifier unit is arranged to separate the digital signal into multiple intermediate signals, each corresponding to a frequency range, and condition, convert and deliver each intermediate signal to a corresponding loudspeaker driver.

7. The home use sound reproduction system according to claim 4, wherein the amplifier unit is arranged to separate the digital signal into multiple intermediate signals, each corresponding to a frequency range, and condition, convert and deliver each intermediate signal to a corresponding loudspeaker driver.

8. The home use sound reproduction system according to claim 1, wherein the amplifier units are arranged to separate out from the common cable, the digital signal corresponding to the sound as it should be delivered to the respective loudspeaker.

9. The home use sound reproduction system according to claim 1, wherein an amplifier unit further comprises an analogue amplifier for processing a signal with high frequency content.

10. The home use sound reproduction system according to claim 1, wherein an amplifier unit comprises a receiver arranged to accept a superimposed signal.

11. The home use sound reproduction system according to claim 10, wherein the system comprises a plurality of loudspeakers, and the superimposed signal is simultaneously delivered to all or a group of the loudspeakers from a common lead in the control unit.

12. The home use sound reproduction system according to claim 11, wherein the receiver or a part of the receiver is arranged to decipher only the digital sound signal or decoded sound information signals intended for the respective loudspeaker, so that loudspeakers can be connected one after another or in branches.

13. The home use sound reproduction system according to claim 10, wherein the receiver or a part of the receiver is comprised in a processor in the amplifier unit.

14. The home use sound reproduction system according to claim 1, wherein the control unit is arranged to receive a digital sound signal from a wall socket or a wireless transceiver.

15. The home use sound reproduction system according to claim 14, wherein the system comprises a plurality of loudspeakers, and the superimposed signal is simultaneously delivered to all or a group of the loudspeakers from a common lead in the control unit.

16. The home use sound reproduction system according to claim 15, wherein the receiver or a part of the receiver is arranged to decipher only the digital sound signal or decoded sound information signals intended for the respective loudspeaker, so that loudspeakers can be connected one after another or in branches.

17. The home use sound reproduction system according to claim 1, wherein the system comprises a plurality of loudspeakers, and the superimposed signal is simultaneously delivered to all or a group of the loudspeakers from a common lead in the control unit.

18. The home use sound reproduction system according to claim 1, wherein each amplifier unit is integrated in a loudspeaker enclosure together with an active loudspeaker.

19. The home use sound reproduction system according to claim 18, wherein the control unit is provided in a second enclosure, which is separate from each loudspeaker enclosure.

20. The home use sound reproduction system according to claim 1, wherein each active loudspeaker comprises a digital signal processor adapted to receive the digital signal transfer of S/PDIF signals from the control unit.

21. The home use sound reproduction system according to claim 20, wherein the amplifier unit is a Class-D amplifier.

\* \* \* \* \*